United States Patent
Hayashi et al.

(10) Patent No.: US 10,538,858 B2
(45) Date of Patent: Jan. 21, 2020

(54) METHOD FOR MANUFACTURING GROUP 13 NITRIDE CRYSTAL AND GROUP 13 NITRIDE CRYSTAL

(71) Applicant: SCIOCS COMPANY LIMITED, Ibaraki (JP)

(72) Inventors: Masahiro Hayashi, Miyagi (JP); Takashi Satoh, Miyagi (JP); Naoya Miyoshi, Miyagi (JP); Junichi Wada, Miyagi (JP); Seiji Sarayama, Miyagi (JP)

(73) Assignee: SCIOCS COMPANY LIMITED, Ibaraki (JP)

( * ) Notice: Subject to any disclaimer, the term of this patent is extended or adjusted under 35 U.S.C. 154(b) by 111 days.

(21) Appl. No.: 15/115,154

(22) PCT Filed: Feb. 19, 2015

(86) PCT No.: PCT/JP2015/055494
§ 371 (c)(1),
(2) Date: Jul. 28, 2016

(87) PCT Pub. No.: WO2015/141420
PCT Pub. Date: Sep. 24, 2015

(65) Prior Publication Data
US 2016/0348272 A1 Dec. 1, 2016

(30) Foreign Application Priority Data

Mar. 18, 2014 (JP) .................................. 2014-054540
Oct. 30, 2014 (JP) .................................. 2014-221791

(51) Int. Cl.
*C30B 19/00* (2006.01)
*C30B 19/06* (2006.01)
(Continued)

(52) U.S. Cl.
CPC .............. *C30B 19/066* (2013.01); *C30B 9/12* (2013.01); *C30B 19/02* (2013.01); *C30B 19/12* (2013.01); *C30B 29/406* (2013.01); *C30B 29/68* (2013.01)

(58) Field of Classification Search
CPC ............ C30B 29/40; C30B 9/02; C30B 19/00
See application file for complete search history.

(56) References Cited

U.S. PATENT DOCUMENTS

| | | | |
|---|---|---|---|
| 2002/0064195 A1 | 5/2002 | Takeya et al. | |
| 2004/0144300 A1 | 7/2004 | Kitaoka et al. | |

(Continued)

FOREIGN PATENT DOCUMENTS

| | | |
|---|---|---|
| CN | 1670916 A | 9/2005 |
| CN | 101558188 A | 10/2009 |

(Continued)

OTHER PUBLICATIONS

European search report dated Jan. 5, 2017 in corresponding European Patent Application No. 15765775.0.
(Continued)

*Primary Examiner* — Robert M Kunemund
(74) *Attorney, Agent, or Firm* — Cooper & Dunham LLP (57) ABSTRACT

In a method for manufacturing a group 13 nitride crystal, a seed crystal made of a group 13 nitride crystal is arranged in a mixed melt containing an alkali metal and a group 13 element, and nitrogen is supplied to the mixed melt to grow the group 13 nitride crystal on a principal plane of the seed crystal. The seed crystal is manufactured by vapor phase epitaxy. At least a part of contact members coming into contact with the mixed melt in a reaction vessel accommodating the mixed melt is made of $Al_2O_3$. An interface layer having a photoluminescence emission peak whose wavelength is longer than the wavelength of a photoluminescence
(Continued)

emission peak of the grown group 13 nitride crystal is formed between the seed crystal and the grown group nitride crystal.

8 Claims, 7 Drawing Sheets

(51) Int. Cl.
    *C30B 19/02*     (2006.01)
    *C30B 19/12*     (2006.01)
    *C30B 29/40*     (2006.01)
    *C30B 9/12*     (2006.01)
    *C30B 29/68*     (2006.01)

(56) References Cited

U.S. PATENT DOCUMENTS

| | | |
|---|---|---|
| 2005/0000407 A1 | 1/2005 | Takeya et al. |
| 2007/0187700 A1 | 8/2007 | Kitaoka et al. |
| 2008/0029783 A1* | 2/2008 | Ueno ............... C30B 25/18 257/190 |
| 2009/0294909 A1 | 12/2009 | Nagai et al. |
| 2010/0078606 A1 | 4/2010 | Yamada et al. |
| 2010/0107969 A1 | 5/2010 | Kuraoka et al. |
| 2010/0192839 A1* | 8/2010 | Hatakeyama ..... H01L 21/02458 117/77 |
| 2011/0012109 A1* | 1/2011 | Kryliouk ............ H01L 21/0237 257/49 |
| 2012/0125255 A1* | 5/2012 | Saito ................. C30B 9/00 117/78 |
| 2013/0221490 A1* | 8/2013 | Shimodaira ............ C30B 9/10 257/615 |
| 2013/0243680 A1 | 9/2013 | Hayashi et al. |
| 2013/0292688 A1* | 11/2013 | Ueno ................ C30B 25/18 257/76 |
| 2014/0030549 A1 | 1/2014 | Yamada et al. |
| 2014/0070370 A1 | 3/2014 | Yamazaki et al. |

FOREIGN PATENT DOCUMENTS

| | | |
|---|---|---|
| CN | 101586253 A | 11/2009 |
| CN | 103668443 A | 3/2014 |
| DE | 102009003296 A1 | 12/2009 |
| EP | 2071062 A1 | 6/2009 |
| JP | 2001-352133 | 12/2001 |
| JP | 2002-076518 | 3/2002 |
| JP | 2002-326898 | 11/2002 |
| JP | 2004-244307 | 9/2004 |
| JP | 2005-263535 | 9/2005 |
| JP | 2008-222519 | 9/2008 |
| JP | 2009-212284 | 9/2009 |
| JP | 2010-001209 | 1/2010 |
| JP | 2010-100449 | 5/2010 |
| JP | 4561784 | 8/2010 |
| JP | 2011-105586 | 6/2011 |
| JP | 2012-006794 | 1/2012 |
| JP | 2013-053068 | 3/2013 |
| JP | 5256198 | 4/2013 |
| JP | 2013-193914 | 9/2013 |
| JP | 2014-051426 | 3/2014 |
| WO | 2009/011407 A1 | 1/2009 |
| WO | WO2010 /079655 A1 | 7/2010 |
| WO | 2010/140665 A1 | 12/2010 |

OTHER PUBLICATIONS

International Search Report dated Apr. 28, 2015 in PCT/JP2015/055494 filed on Feb. 19, 2015.
M. Reshchikov, H. Morkoc; "Luminescence properties of defects in GaN", Journal of Applied Physics 97, Jun. 13, 2001 (2005).
Feb. 1, 2018 Chinese Official Action (and English translation thereof) in connection with corresponding Chinese patent application No. 201580014199.6.
Sep. 25, 2018 Japanese Official Action in connection with corresponding Japanese patent application No. 2014-221791.
Japanese official action (and machine translation thereof into English) dated Mar. 22, 2019 in corresponding Japanese Patent Application No. 2014-221791.

* cited by examiner

METHOD FOR MANUFACTURING GROUP 13 NITRIDE CRYSTAL AND GROUP 13 NITRIDE CRYSTAL

TECHNICAL FIELD

The present invention relates to a method for manufacturing a group 13 nitride crystal and to the group 13 nitride crystal.

BACKGROUND ART

Group-13-nitride-based semiconductor materials, such as gallium nitride (GaN), are known as materials used for semiconductor devices, such as blue light-emitting diodes (LEDs), white LEDs, and laser diodes (LDs). There have been developed vapor phase epitaxy and liquid phase epitaxy as methods for manufacturing a group 13 nitride crystal.

The vapor phase epitaxy is a method for growing a group 13 nitride crystal on a seed substrate in a vapor phase. Examples of the vapor phase epitaxy include metal organic chemical vapor deposition (MOCVD), molecular beam epitaxy (MBE), and hydride vapor phase epitaxy (HVPE). To manufacture a group 13 nitride crystal self-standing substrate by the vapor phase epitaxy, a method for reducing the dislocation density is frequently used, such as epitaxial lateral overgrowth (ELO). In the method, GaN is thickly grown by HVPE on a heterogeneous substrate, such as a sapphire substrate and a gallium arsenide (GaAs) substrate, and the GaN crystal thick film is then separated from the heterogeneous substrate, for example. The GaN self-standing substrate manufactured in this manner has a dislocation density of approximately $10^6$ cm$^{-2}$, for example.

The liquid phase epitaxy is a method for growing a group 13 nitride crystal on a seed substrate (a seed crystal) in a liquid phase. Examples of the known liquid phase epitaxy include a flux method. The flux method is a method for growing a group 13 nitride crystal on a seed crystal by: arranging a seed crystal made of a group 13 nitride crystal in a mixed melt containing an alkali metal, such as sodium (Na) and potassium (K), and a group 13 element, such as Ga and aluminum (Al); and supplying nitrogen to the mixed melt. In the flux method, the mixed melt is heated to approximately 900° C. under an atmosphere at nitrogen pressure equal to or lower than 10 MPa to dissolve nitrogen into the mixed melt from the vapor phase. Thus, the nitrogen reacts with the group 13 element in the mixed melt, thereby growing the group 13 nitride crystal. The flux method enables the crystal to grow at lower temperature and lower pressure than other types of liquid phase epitaxy do. Furthermore, the grown group 13 nitride crystal advantageously has a dislocation density lower than $10^6$ cm$^{-2}$, for example.

Patent Literatures 1 to 3 describe a method for growing a GaN crystal on a seed crystal made of a GaN substrate by the flux method. Patent Literature 3 describes an off-angle of a seed substrate used in the flux method. Patent Literatures 4 and 5 describe a reaction vessel used in the flux method. Patent Literature 4 describes that, by using Al$_2$O$_3$ as a material for the reaction vessel, Al$_2$O$_3$ is dissolved during the crystal growth process, thereby changing the weight of the reaction vessel. Patent Literature 6 describes a result of measurement with cathode luminescence of a GaN crystal grown by the vapor phase epitaxy. Non-patent Literature 1 describes luminescence characteristics in a case where impurities are included in a GaN crystal.

To meet recent demands for reduction in cost of white LEDs and application of white LEDs to electronic devices, for example, a group 13 nitride crystal is expected to have a larger diameter. A relatively small group 13 nitride crystal self-standing substrate can be usually manufactured at lower cost by the vapor phase epitaxy than by the flux method. In a case where the self-standing substrate is enlarged and the vapor phase epitaxy is applied, however, failures such as a warp and a crack easily occur because of a difference in the coefficient of thermal expansion and a difference in the lattice constant between the heterogeneous substrate and the group 13 nitride crystal, for example. Thus, it is difficult to manufacture a large and high-quality group 13 nitride crystal by the vapor phase epitaxy alone.

Because the flux method requires no heterogeneous substrate, a failure such as a warp does not easily occur. Thus, the flux method is suitably used to manufacture a large and high-quality group 13 nitride crystal. The flux method, however, requires a higher manufacturing cost than that of the vapor phase epitaxy.

In view of the circumstances described above, the present invention aims to manufacture a high-quality group 13 nitride crystal at low cost.

SUMMARY OF THE INVENTION

According to an embodiment, provided is a method for manufacturing a group 13 nitride crystal, the method in which a seed crystal made of a group 13 nitride crystal is arranged in a mixed melt containing an alkali metal and a group 13 element, and nitrogen is supplied to the mixed melt to grow the group 13 nitride crystal on a principal plane of the seed crystal, wherein the seed crystal is manufactured by vapor phase epitaxy, at least a part of a contact member coming into contact with the mixed melt in a reaction vessel accommodating the mixed melt is made of Al$_2$O$_3$, and an interface layer having a photoluminescence emission peak whose wavelength is longer than a wavelength of a photoluminescence emission peak of the grown group 13 nitride crystal is formed between the seed crystal and the grown group 13 nitride crystal.

The above and other objects, features, advantages and technical and industrial significance of this invention will be better understood by reading the following detailed description of presently preferred embodiments of the invention, when considered in connection with the accompanying drawings.

DESCRIPTION OF EMBODIMENTS

Embodiments

Figure 1:
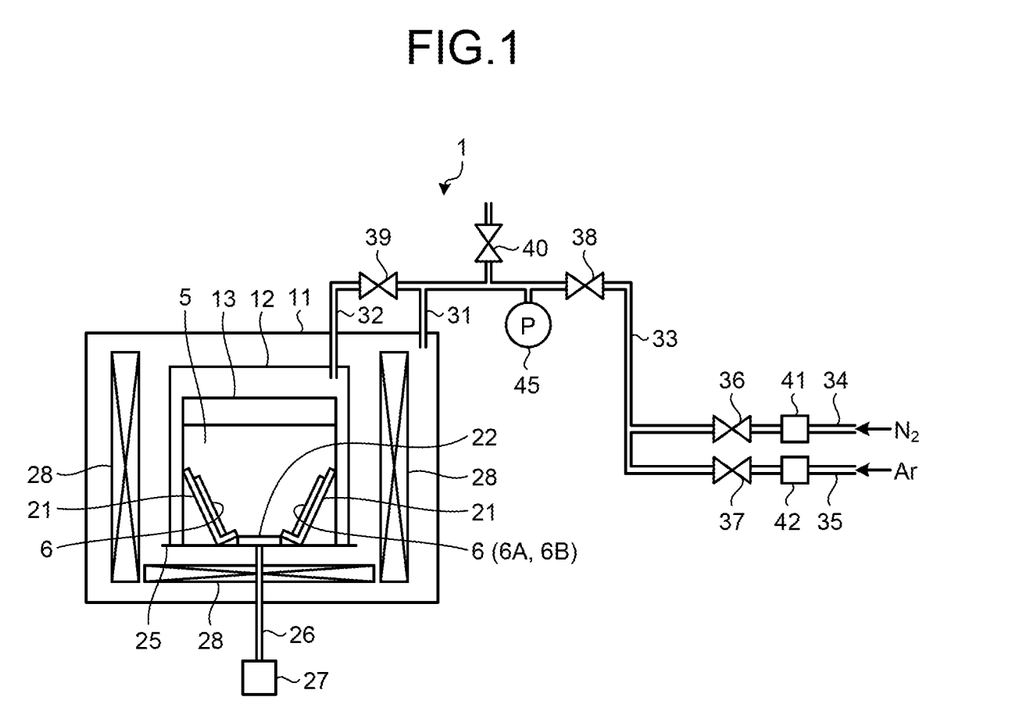
FIG. 1 is an exemplary diagram of a configuration of a manufacturing apparatus used in a method for manufacturing a group 13 nitride crystal according to a first embodiment.

Exemplary embodiments of a method for manufacturing a group 13 nitride crystal are described below in greater detail with reference to the accompanying drawings. FIG. 1 is an exemplary diagram of a configuration of a manufacturing apparatus 1 used in the method for manufacturing a group 13 nitride crystal according to an embodiment. The manufacturing apparatus 1 manufactures a group 13 nitride crystal with the flux method.

A pressure resistant vessel 11 is made of stainless steel, for example. The pressure resistant vessel 11 accommodates an inner vessel 12. The inner vessel 12 accommodates a reaction vessel 13.

The reaction vessel 13 retains a mixed melt (flux) 5 containing an alkali metal and a group 13 element and a seed crystal 6. The reaction vessel 13 grows a group 13 nitride crystal in the mixed melt 5 using the seed crystal 6 as a nucleus. The reaction vessel 13 accommodates a holding member 21 and a fixing member 22. The holding member 21 holds the seed crystal 6. The fixing member 22 fixes the holding member 21 to the bottom of the reaction vessel 13.

At least a part of contact members coming into contact with the mixed melt 5 in the reaction vessel 13 is made of alumina ($Al_2O_3$). In the present embodiment, at least a part of the inner wall of the reaction vessel 13, the holding member 21, and the fixing member 22 is made of alumina. All the members coming into contact with the mixed melt 5 are not necessarily made of alumina. The materials other than alumina used for the members coming into contact with the mixed melt 5 are preferably hard to react with the mixed melt 5. Examples of the materials other than alumina include a nitride such as an aluminum nitride, an oxide such as yttrium aluminum garnet (YAG), and stainless steel (SUS).

The purity of alumina used for the contact members is preferably equal to or higher than 99.9%. If the purity is lower than 99.9%, polycrystallization due to impurities may occur during the crystal growth, and the crystal growth speed may decrease. More preferably, the silicon (Si) concentration in alumina is lower than 100 ppm. If the Si concentration is equal to or higher than 100 ppm, the crystal growth speed may decrease.

The mixed melt 5 contains an alkali metal and a group 13 element. The alkali metal is at least one of Na, lithium (Li), and K and is preferably Na having purity equal to or higher than 99.95%. If the purity is lower than 99.95%, a miscellaneous crystal may be generated on the surface of the mixed melt 5, and the crystal growth speed may decrease. The group 13 element is at least one of boron (B), Al, Ga, indium (In), and thallium (Tl) and is preferably Ga. Examples of a typical mixed melt 5 include a Ga—Na mixed melt.

The seed crystal 6 according to the present embodiment is made of a group 13 nitride crystal manufactured by the vapor phase epitaxy. Examples of the vapor phase epitaxy include MOCVD, MBE, and HVPE. The seed crystal 6 has a substrate shape and preferably has a principal plane that enables the crystal to grow in the same orientation. The principal plane serves as a base of growth of the group 13 nitride crystal. If the crystal cannot be grown in the same orientation, an inclusion is easily generated at a portion where facets come into contact with each other in the crystal growth. In other words, in the case of using the seed crystal 6 formed into a substrate shape and having the principal plane that enables the crystal to grow in the same orientation, a failure such as an inclusion can be reduced. The inclusion is a substance incorporated into the grown and solidified group 13 nitride crystal. The substance according to the present embodiment corresponds to the mixed melt 5.

Figure 2A:
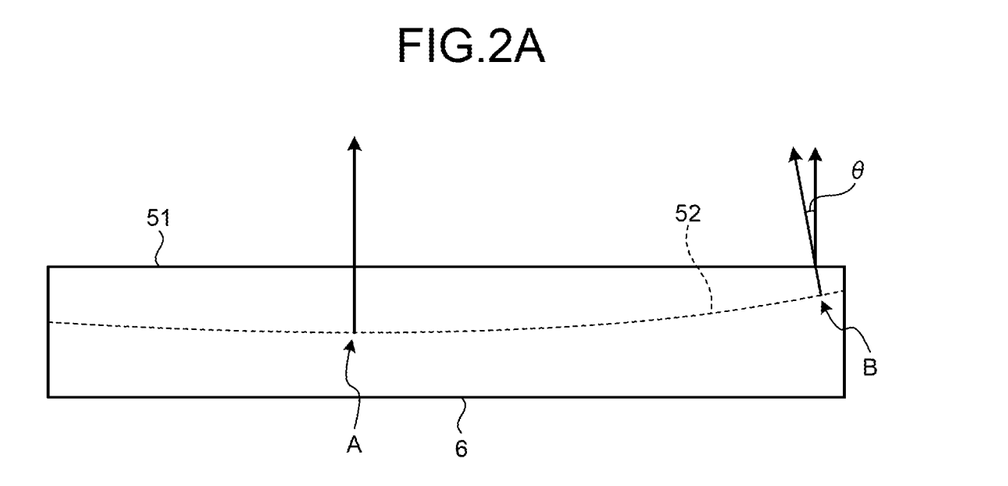
FIG. 2A is an exemplary diagram of an off-angle to a principal plane of a seed crystal.
Figure 2B:
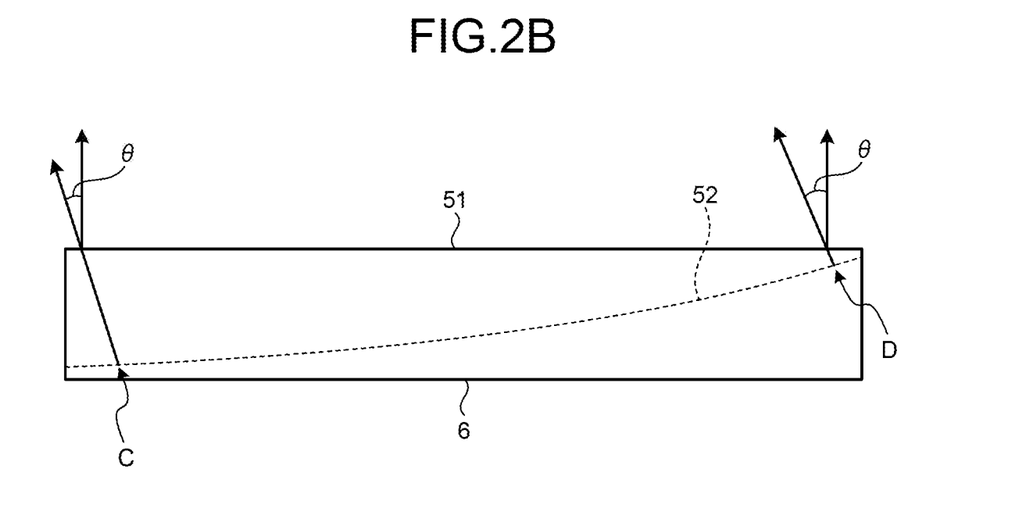
FIG. 2B is an exemplary diagram of another off-angle to the principal plane of the seed crystal.

The incorporation amount (content percentage) of the inclusion depends on an off-angle to the principal plane of the seed crystal 6. FIGS. 2A and 2B are exemplary diagrams of an off-angle θ to the principal plane. The off-angle θ is an angle between a surface 51 of the seed crystal 6 and a crystal lattice plane 52 of a group 13 nitride crystal (0001) constituting the seed crystal 6. In the present example, the off-angle θ is represented as an angle between the normal line of the surface 51 and that of the crystal lattice plane 52. A larger off-angle θ tends to increase the incorporation amount of the inclusion, whereas a smaller off-angle θ tends to decrease the incorporation amount of the inclusion.

The off-angle θ also affects the dislocation density of the grown crystal. A larger off-angle θ tends to decrease the dislocation density, whereas a smaller off-angle θ tends to increase the dislocation density.

By maintaining the off-angle θ within an appropriate range, both suppression of the inclusion and reduction in the dislocation density can be achieved. The off-angle θ is preferably larger than 0° and equal to or smaller than 2°. If the off-angle θ is equal to or smaller than 2°, the content percentage of the inclusion can be suppressed so as to enable the grown group 13 nitride crystal to carry out sufficient functions as an electronic device. The off-angle θ is more preferably equal to or smaller than 0.5°. If the off-angle θ is equal to or smaller than 0.5°, the inclusion is scarcely generated.

To form an ideal off-angle θ, it is necessary to process the crystal such that the principal plane is formed into a flat plane, more preferably, into a mirror plane after the crystal growth. While the crystal lattice plane 52 is ideally formed into a flat plane (the radius of curvature is infinite), it is frequently formed into a curved plane in an actual structure. Because the crystal growth technology and the surface processing technology for the group 13 nitride crystal are not sufficiently developed compared with those for a Si crystal, for example, it is generally difficult to form the crystal lattice plane 52 into a flat plane. Thus, in a case where the surface 51 of the seed crystal 6 made of a group 13 nitride crystal is a flat plane, the single seed crystal 6 frequently has a plurality of different off-angles θ. All the off-angles θ desirably fall within the range described above.

FIG. 2A illustrates the seed crystal 6 including a portion A having an off-angle θ of 0° and a portion B having an off-angle θ of 0.5°. FIG. 2B illustrates the seed crystal 6 including a portion C having an off-angle θ of 1.5° and a portion D having an off-angle θ of 2.0°. As described above, the crystal lattice plane 52 in the seed crystal 6 may be formed into a curved plane. The curvature of the curved plane may be constant, or the crystal lattice plane 52 may have an uneven shape including uneven structures. In other words, the seed crystal 6 may have distribution of the off-angles θ. The shape of the crystal lattice plane 52 and the off-angle θ can be measured by an X-ray diffraction apparatus, for example.

As illustrated in FIG. 1, the seed crystal 6 is arranged in the reaction vessel 13 in a manner immersed in the mixed melt 5. The seed crystal 6 according to the present embodiment is held by the holding member 21 in the reaction vessel 13. The seed crystal 6 is obliquely held by the holding member 21.

The inner vessel 12 is detachably arranged on a turntable 25 in the pressure resistant vessel 11. The turntable 25 is fixed to a rotating shaft 26 and is rotatable by a rotating mechanism 27 arranged outside the pressure resistant vessel 11. The rotating mechanism 27 rotates the rotating shaft 26 with a motor or the like. The rotation speed and the rotation direction of the rotating shaft 26 are controlled by a control unit (not illustrated) including a computer that operates based on a computer program and various types of logic circuits, for example. The inner vessel 12, the reaction vessel 13, the holding member 21 in the reaction vessel 13, and the like rotate along with the rotation of the rotating shaft 26. The objects that rotate along with the rotation of the rotating shaft 26 are not limited thereto. A heater 28 may also rotate, or the reaction vessel 13 alone may rotate. The mixed melt 5 is stirred along with the rotation of the reaction vessel 13.

The inside of the pressure resistant vessel 11 is supplied with a source gas containing nitrogen. As illustrated in FIG. 1, the internal space of the pressure resistant vessel 11 and that of the inner vessel 12 are connected to pipes 31 and 32, respectively. The pipes 31 and 32 supply a nitrogen ($N_2$) gas serving as a source material for the group 13 nitride crystal and a diluent gas for adjusting the total pressure. A pipe 33 connected to the pipes 31 and 32 bifurcates into a nitrogen supply pipe 34 and the diluent gas supply pipe 35 on the upstream. The nitrogen supply pipe 34 and the diluent gas supply pipe 35 are provided with valves 36 and 37, respectively. While an inert argon (Ar) gas is preferably used as the diluent gas, it is not limited thereto. Alternatively, helium (He), neon (Ne), or the like may be used.

The nitrogen gas flows into the nitrogen supply pipe 34 from a gas cylinder or the like. After the pressure of the nitrogen gas is adjusted by a pressure control device 41, the nitrogen gas flows into the pipe 33 via the valve 36. By contrast, the diluent gas flows into the diluent gas supply pipe 35 from a gas cylinder or the like. After the pressure of the diluent gas is adjusted by a pressure control device 42, the diluent gas flows into the pipe 33 via the valve 37. The nitrogen gas and the diluent gas whose pressures are adjusted in this manner are made into a mixed gas in the pipe 33.

The mixed gas is supplied to the internal space of the pressure resistant vessel 11 from the pipe 33 via the valve 38 and the pipe 31 and to the internal space of the inner vessel 12 via the valve 39 and the pipe 32. The internal space of the inner vessel 12 communicates with that of the reaction vessel 13 in the pressure resistant vessel 11. The atmosphere and the pressures of these internal spaces are substantially the same. The inner vessel 12 can be detached from the manufacturing apparatus 1. The pipe 33 is connected to the outside via a valve 40.

The pipe 33 is provided with a pressure gauge 45. By monitoring the pressure gauge 45, the pressures in the internal spaces of the pressure resistant vessel 11 and the inner vessel 12 (reaction vessel 13) can be adjusted. Thus, by adjusting the pressure of the nitrogen gas and the diluent gas with the valves 36 to 40 and the pressure control devices 41 and 42, the partial pressure of nitrogen in the reaction vessel 13 can be adjusted. Because the total pressures in the pressure resistant vessel 11 and the inner vessel 12 can be adjusted, evaporation of the mixed melt 5 (e.g., Na) in the reaction vessel 13 can be suppressed by increasing the total pressure in the inner vessel 12. In other words, the partial pressure of nitrogen that affects the crystal growth conditions for a group 13 nitride (e.g., GaN) and the total pressure that affects evaporation of the mixed melt 5 can be separately controlled. Needless to say, the nitrogen gas alone may be introduced into the reaction vessel 13 without introducing the diluent gas. The entire configuration of the manufacturing apparatus 1 illustrated in FIG. 1 is given by way of example only. A change in the mechanism that supplies the gas containing nitrogen to the reaction vessel 13 and in the rotating mechanism 27, for example, does not affect the scope of the present invention.

As illustrated in FIG. 1, the heater 28 is arranged around the inner vessel 12 and below the bottom of the inner vessel 12 in the pressure resistant vessel 11. The heater 28 heats the inner vessel 12 and the reaction vessel 13 to adjust the temperature of the mixed melt 5. The seed crystal 6, the source materials (the alkali metal and the group 13 element), an additive such as carbon (C), a dopant such as germanium (Ge), and the like are put in the reaction vessel 13 with the inner vessel 12 placed in a glove box under an inert gas atmosphere such as an argon gas atmosphere. This operation may be performed with the reaction vessel 13 placed in the inner vessel 12.

The molar ratio of the group 13 element to the alkali metal contained in the mixed melt 5 is not particularly limited. The molar ratio of the alkali metal to the total molar number of the group 13 element and the alkali metal is preferably 40% to 95%.

After the source materials and the like are put in the vessel, the heater 28 is energized to heat the inner vessel 12 and the reaction vessel 13 to a crystal growth temperature. As a result, the group 13 element and the alkali metal serving as the source materials and the other added substances are melted in the reaction vessel 13, whereby the mixed melt 5 is produced. By bringing the source gas having a predetermined partial pressure of nitrogen into contact with the mixed melt 5, nitrogen is dissolved into the mixed melt 5 from the vapor phase. The source materials dissolved in the mixed melt 5 are supplied to the surface of the seed crystal 6, whereby the group 13 nitride crystal is grown using the seed crystal 6 as a nucleus.

In the crystal growth process described above, the rotating mechanism 27 rotates the reaction vessel 13 to stir the mixed melt 5, thereby uniformly distributing the nitrogen concentration in the mixed melt 5. Because crystal growth is carried out for a long time in the mixed melt 5 having uniform nitrogen concentration distribution, a high-quality and large group 13 nitrogen crystal can be manufactured.

The manner of rotating the reaction vessel 13 during the crystal growth is not particularly limited. If the reaction vessel 13 is continuously rotated at a constant speed, the mixed melt 5 is moved at the same speed as that of the reaction vessel 13 and the nitride crystal (seed crystal 6). As a result, the effect of stirring the mixed melt 5 is not obtained. The mixed melt 5 is preferably stirred under rotation control including acceleration, deceleration, and reversal, for example. The mixed melt 5 is preferably not stirred intensely because intense stirring thereof causes a miscellaneous crystal to generate. A specific stirring method is described in Japanese Patent Application Laid-open No. 2014-054470, for example. In the present embodiment, stirring preferably starts at the time when the group 13 element and the alkali metal are heated to produce the mixed melt 5.

EXAMPLE 1-1

The following describes examples where a group 13 nitride crystal is manufactured using the manufacturing apparatus 1 according to the present embodiment. Two commercially available GaN crystal substrates manufactured by HVPE were prepared as the seed crystal 6. The seed crystal manufactured by HVPE (vapor phase epitaxy) is hereinafter denoted by 6A. The seed crystal 6A made of these GaN crystal substrates was an n-type semiconductor doped with Si, and the carrier concentration thereof was $2 \times 10^{18}$ cm$^{-3}$. The seed crystal 6A had a 2 inch size and a thickness of 0.4 mm and was mirror-finished.

The reaction vessel 13 and the holding member 21 made of Al$_2$O$_3$ (alumina) having purity of 99.95% and Si concentration of 63 ppm were used as the contact members coming into contact with the mixed melt 5 in the reaction vessel 13. The off-angle θ to the principal plane of the seed crystal 6A was 0° to 0.5° (refer to FIG. 2A).

Subsequently, the holding member 21 was placed in the reaction vessel 13 in a glove box under a high-purity Ar atmosphere, and the seed crystal 6A serving as the GaN crystal substrate was then placed on the holding member 21. The seed crystal 6A and the holding member 21 were placed in the reaction vessel 13 as illustrated in FIG. 1.

Subsequently, Na heated to be a liquid was put in the reaction vessel 13 in the glove box. After Na solidified, Ga and C were put in the reaction vessel 13. In the present example, the molar ratio of Ga to Na was 0.25 to 0.75. C and Ge were added as the added substances. The addition amount of C was 0.5% to the total molar number of Ga, Na, and C, and the addition amount of Ge was 2.0% to the molar number of Ga alone. The used Na had purity of 99.95%.

Subsequently, the reaction vessel 13 was housed in the inner vessel 12, and the inner vessel 12 taken out from the glove box was incorporated into the manufacturing apparatus 1. The pressure of the nitrogen gas in the inner vessel 12 was adjusted to 2.2 MPa. The heater 28 was energized to heat the reaction vessel 13 to the crystal growth temperature of GaN. The temperature condition in the crystal growth process was set to 870° C., and the pressure of the nitrogen gas was set to 3.0 MPa. The reaction vessel 13 (rotating shaft 26) in this state was rotated while being accelerated and decelerated, and the crystal growth was continued for 100 hours.

Figure 3:
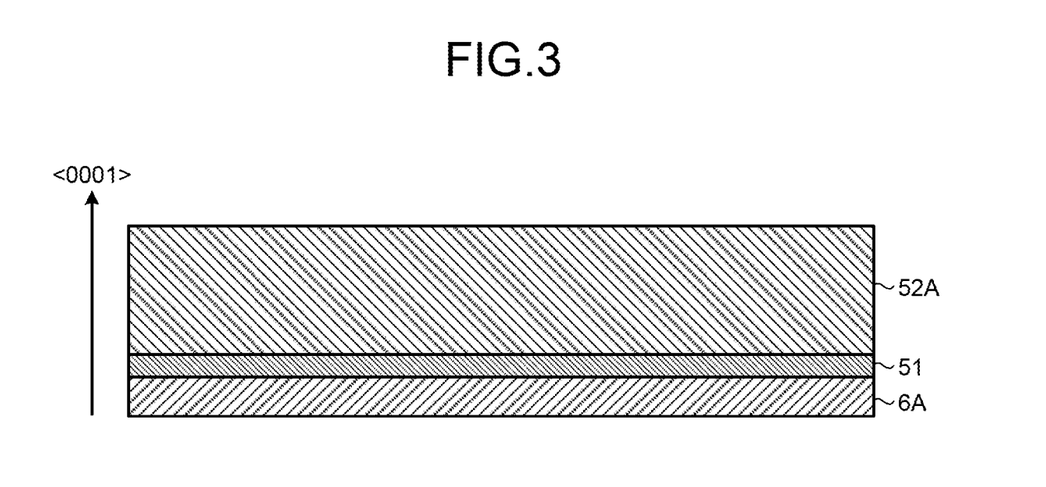
FIG. 3 is a diagram of a state of crystal growth according to examples 1-1, 1-2, and 1-3, and a comparative example 2-1.

As a result, a GaN crystal having a thickness of 1.2 mm (including a thickness of the seed crystal 6A of 0.4 mm) was manufactured. FIG. 3 is a diagram of a state of crystal growth according to the example 1-1. As illustrated in FIG. 3, an interface layer 51 was formed on the surface of the seed crystal 6A (c-plane in the 0001 direction), and a GaN crystal 52A was formed on the interface layer 51. In other words, the interface layer 51 having different physical properties from those of the seed crystal 6A and the GaN crystal 52A was formed between the crystals 6A and 52A.

EXAMPLE 1-2

In the present example, the reaction vessel 13 and the holding member 21 made of alumina having purity of 99.95% and Si concentration of 52 ppm were used as the contact members coming into contact with the mixed melt 5 in the reaction vessel 13. The seed crystal 6A having an off-angle θ to the principal plane of 0.5° to 1.0° was used. A GaN crystal was grown with the other conditions made the same as those of the example 1-1.

As a result, a GaN crystal having a thickness of 1.1 mm was manufactured. The GaN crystal is formed into the state illustrated in FIG. 3 similarly to the example 1-1. In other words, the interface layer 51 was formed between the seed crystal 6A and the GaN crystal 52A.

EXAMPLE 1-3

In the present example, the reaction vessel 13 and the holding member 21 made of alumina having purity of 99.95% and Si concentration of 83 ppm were used as the contact members coming into contact with the mixed melt 5 in the reaction vessel 13. The seed crystal 6A having an off-angle θ to the principal plane of 1.5° to 2.0° was used. A GaN crystal was grown with the other conditions made the same as those of the example 1-1.

As a result, a GaN crystal having a thickness of 1.2 mm was manufactured. The GaN crystal is formed into the state illustrated in FIG. 3 similarly to the example 1-1. In other words, the interface layer 51 was formed between the seed crystal 6A and the GaN crystal 52A.

COMPARATIVE EXAMPLE 1-1

In the present comparative example, the reaction vessel 13 and the holding member 21 made of YAG having purity of 99.99% and Si concentration of 37 ppm were used as the contact members coming into contact with the mixed melt 5 in the reaction vessel 13. A GaN crystal was grown with the other conditions made the same as those of the example 1-1.

Figure 4:
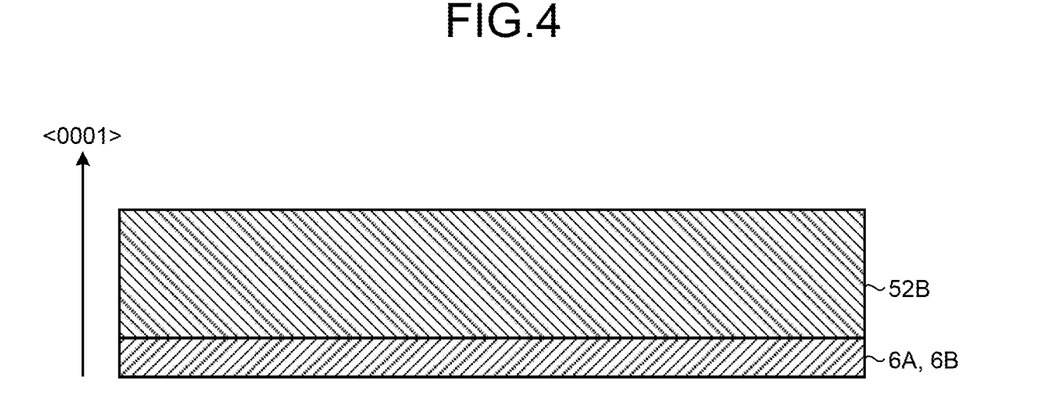
FIG. 4 is a diagram of a state of crystal growth according to comparative examples 1-1, 1-2, 1-3, and 2-2.

As a result, a GaN crystal having a thickness of 1.1 mm was manufactured. FIG. 4 is a diagram of a state of crystal growth according to the comparative example 1-1. As illustrated in FIG. 4, a GaN crystal 52B was directly formed on the surface of the seed crystal 6A (c-plane in the 0001 direction), and the interface layer 51 illustrated in FIG. 3 was not formed.

COMPARATIVE EXAMPLE 1-2

In the present comparative example, the reaction vessel 13 and the holding member 21 made of YAG having purity of 99.99% and Si concentration of 69 ppm were used as the contact members coming into contact with the mixed melt 5 in the reaction vessel 13. A GaN crystal was grown with the other conditions made the same as those of the example 1-1.

As a result, a GaN crystal having a thickness of 1.2 mm was manufactured. The GaN crystal is formed into the state illustrated in FIG. 4 similarly to the comparative example 1-1. In other words, the GaN crystal 52B was directly formed on the seed crystal 6A, and no interface layer 51 was formed.

COMPARATIVE EXAMPLE 1-3

In the present comparative example, the reaction vessel 13 and the holding member 21 made of YAG having purity of 99.99% and Si concentration of 49 ppm were used as the contact members coming into contact with the mixed melt 5 in the reaction vessel 13. The seed crystal 6A having an off-angle θ to the principal plane of 1.5° to 2.0° was used.

A GaN crystal was grown with the other conditions made the same as those of the example 1-1.

As a result, a GaN crystal having a thickness of 1.2 mm was manufactured. The GaN crystal is formed into the state illustrated in FIG. 4 similarly to the comparative example 1-1. In other words, the GaN crystal 52B was directly formed on the seed crystal 6A, and no interface layer 51 was formed.

COMPARATIVE EXAMPLE 2-1

In the present comparative example, the reaction vessel 13 and the holding member 21 made of alumina having purity of 99.95% and Si concentration of 44 ppm were used as the contact members coming into contact with the mixed melt 5 in the reaction vessel 13. The seed crystal 6A having an off-angle θ to the principal plane of 2.5° to 3.0° was used. A GaN crystal was grown with the other conditions made the same as those of the example 1-1.

As a result, a GaN crystal having a thickness of 1.3 mm was manufactured. The GaN crystal is formed into the state illustrated in FIG. 3 similarly to the example 1-1. In other words, the interface layer 51 was formed between the seed crystal 6A and the GaN crystal 52A. The present comparative example was different from the example 1-1 in the inclusion in the GaN crystal 52A, which will be described later in detail.

COMPARATIVE EXAMPLE 2-2

In the present comparative example, the reaction vessel 13 and the holding member 21 made of YAG having purity of 99.99% and Si concentration of 72 ppm were used as the contact members coming into contact with the mixed melt 5 in the reaction vessel 13. The seed crystal 6A having an off-angle θ to the principal plane of 2.5° to 3.0° was used. A GaN crystal was grown with the other conditions made the same as those of the example 1-1.

As a result, a GaN crystal having a thickness of 1.2 mm was manufactured. The GaN crystal is formed into the state illustrated in FIG. 4 similarly to the comparative example 1-1. In other words, the GaN crystal 52B was directly formed on the seed crystal 6A, and no interface layer 51 was formed.

COMPARATIVE EXAMPLE 3

In the present comparative example, the reaction vessel 13 and the holding member 21 made of alumina having purity of 99.80% and Si concentration of 25 ppm were used as the contact members coming into contact with the mixed melt 5 in the reaction vessel 13. A GaN crystal was grown with the other conditions made the same as those of the example 1-1.

Figure 5:
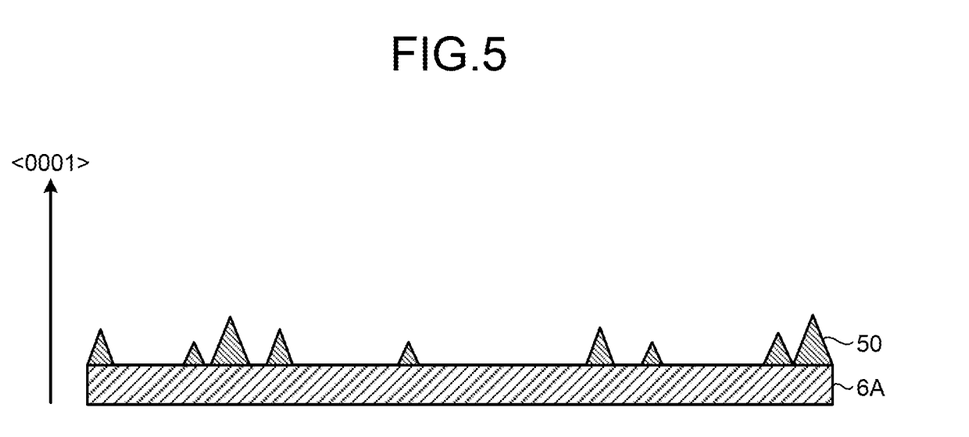
FIG. 5 is a diagram of a state of crystal growth according to a comparative example 3.

As a result, generation of a number of fine nuclei was detected around the seed crystal 6A, and no GaN single crystal was grown. The crystal produced along with generation of nuclei is hereinafter referred to as a miscellaneous crystal, and a phenomenon of attachment of miscellaneous crystals is referred to as being miscellaneous. FIG. 5 is a diagram of a state of crystal growth according to the comparative example 3. Miscellaneous crystals 50 are formed on the surface of the seed crystal 6A, and no GaN crystal is grown. In other words, the seed crystal 6A was made miscellaneous.

COMPARATIVE EXAMPLE 4

In the present comparative example, the reaction vessel 13 and the holding member 21 made of alumina having purity of 99.95% and Si concentration of 114 ppm were used as the contact members coming into contact with the mixed melt 5 in the reaction vessel 13. A GaN crystal was grown with the other conditions made the same as those of the example 1-1.

As a result, no GaN crystal was formed on the seed crystal 6A.

COMPARATIVE EXAMPLE 5

In the present comparative example, Na having purity of 99.84% was used to produce the mixed melt 5. A GaN crystal was grown with the other conditions made the same as those of the example 1-1.

As a result, the seed crystal 6A was made miscellaneous similarly to the comparative example 3 as illustrated in FIG. 5.

COMPARATIVE EXAMPLE 6

In the present comparative example, a GaN crystal substrate manufactured by the flux method was used as the seed crystal. The seed crystal manufactured by the flux method is hereinafter denoted by 6B. The seed crystal 6B is obtained by processing the GaN crystal 52A manufactured in the example 1-3. The seed crystal 6B had a 2 inch size and a thickness of 0.4 mm. The process was performed such that the off-angle θ to the principal plane of the seed crystal 6B is 1.5° to 2.0°. The reaction vessel 13 and the holding member 21 made of alumina having purity of 99.95% and Si concentration of 34 ppm were used as the contact members coming into contact with the mixed melt 5 in the reaction vessel 13. A GaN crystal was grown with the other conditions made the same as those of the example 1-1.

As a result, a GaN crystal having a thickness of 1.1 mm was manufactured. In the GaN crystal, the GaN crystal 52A was directly formed on the seed crystal 6B, and no interface layer 51 was formed.

The following indicates evaluation of the crystals manufactured in the examples 1-1, 1-2, and 1-3 and the comparative examples 1-1, 1-2, 1-3, 2-1, 2-2, 3, 4, 5, and 6.

Evaluation on the Dislocation Density

The grown GaN crystals 52A and 52B were processed, and the c-plane was mirror-finished. By measuring the dark spot density with a cathode luminescence device, the dislocation densities of the GaN crystals 52A and 52B were evaluated. The dislocation densities of the GaN crystal substrates used as the seed crystals 6A and 6B were measured in advance. Table 1 presents the results. The measurement of the dislocation density was made not on the interface layer 51 but on a crystal growth portion (portions represented by 52A and 52B).

TABLE 1

| | Pre-growth conditions | | | | | | | After growth Evaluation results | | | |
|---|---|---|---|---|---|---|---|---|---|---|---|
| | Contact member | | | Alkali metal Na purity | Seed crystal | | | | Presence of interface layer | Dislocation density | Inclusion |
| | Material | Purity | Si concentration | | Manufacturing method | Dislocation density | Off angle | Crystal thickness | | | |
| Example 1-1 | Alumina | 99.95% | 63 ppm | 99.95% | HVPE | $5 \times 10^6$/cm$^2$ | 0° to 0.5° | 1.2 mm | Present | $2.4 \times 10^5$/cm$^2$ | 0.0% |
| Example 1-2 | | | 52 ppm | | | | 0.5° to 1.0° | 1.1 mm | Present | $2.2 \times 10^5$/cm$^2$ | 0.7% |
| Example 1-3 | | | 83 ppm | | | | 1.5° to 2.0° | 1.2 mm | Present | $2.0 \times 10^5$/cm$^2$ | 3.6% |
| Comparative example 1-1 | YAG | 99.99% | 37 ppm | | | | 0° to 0.5° | 1.1 mm | Absent | $1 \times 10^6$/cm$^2$ | 0.0% |
| Comparative example 1-2 | | | 69 ppm | | | | 0.5° to 1.0° | 1.2 mm | Absent | $6.4 \times 10^5$/cm$^2$ | 0.8% |
| Comparative example 1-3 | | | 49 ppm | | | | 1.5° to 2.0° | 1.2 mm | Absent | $4.3 \times 10^5$/cm$^2$ | 2.7% |
| Comparative example 2-1 | Alumina | 99.95% | 44 ppm | | | | 2.5° to 3.0° | 1.3 mm | Present | $1.7 \times 10^5$/cm$^2$ | 13.3% |
| Comparative example 2-2 | YAG | 99.99% | 72 ppm | | | | 2.5° to 3.0° | 1.2 mm | Absent | $2.9 \times 10^5$/cm$^2$ | 10.2% |
| Comparative example 3 | alumina | 99.80% | 25 ppm | | | | 0° to 0.5° | Miscellaneous | | | |
| Comparative example 4 | | 99.95% | 114 ppm | | | | 0° to 0.5° | Not grown | | | |
| Comparative example 5 | | | 76 ppm | 99.84% | | | 0° to 0.5° | Miscellaneous | | | |
| Comparative example 6 | | | 34 ppm | 99.95% | Flux method | $2.5 \times 10^5$/cm$^2$ | 1.5° to 2.0° | 1.1 mm | Absent | $2.1 \times 10^5$/cm$^2$ | 3.8% |

As indicated in Table 1, the dislocation density ($2.4 \times 10^5$ cm$^{-2}$) of the GaN crystal 52A in the example 1-1 where alumina was used for the contact members coming into contact with the mixed melt 5 in the reaction vessel 13 is smaller than the dislocation density ($5 \times 10^6$ cm$^{-2}$) of the seed crystal 6A manufactured by the vapor phase epitaxy by one figure or more. The dislocation densities ($2.2 \times 10^5$ cm$^{-2}$ and $2.0 \times 10^5$ cm$^{-2}$) of the GaN crystal 52A in the other examples 1-2 and 1-3, respectively, where alumina was used show similar results to that of the example 1-1.

By contrast, the dislocation density ($1 \times 10^6$ cm$^{-2}$) of the GaN crystal 52B in the comparative example 1-1 where YAG was used for the contact members is smaller than the dislocation density ($5 \times 10^6$ cm$^{-2}$) of the seed crystal 6A not by one figure or more unlike the example 1-1. The dislocation density of the GaN crystal 52B in the comparative example 1-1 is approximately four times as large as that of the GaN crystal 52A in the example 1-1. The dislocation densities ($6.4 \times 10^5$ cm$^{-2}$ and $4.3 \times 10^5$ cm$^{-2}$) of the GaN crystal 52B in the other comparative examples 1-2 and 1-3, respectively, where YAG was used show similar results to that of the comparative example 1-1 in terms of reduction in the dislocation density compared with that of the seed crystal 6A.

The dislocation densities in the examples 1-2 and 1-3 are smaller than the dislocation density in the example 1-1. The dislocation densities in the comparative examples 1-2 and 1-3 are smaller than the dislocation density in the comparative example 1-1. These results indicate that the off-angle θ of the seed crystal 6A affects the dislocation density of the grown GaN crystals 52A and 52B. As indicated in Table 1, the dislocation density of the grown GaN crystals 52A and 52B tends to decrease as the off-angle θ of the seed crystal 6 increases.

With the same off-angle θ (e.g., 0.5° to 1.0° in the example 1-2 and the comparative example 1-2), it is indicated that the dislocation density ($2.2 \times 10^5$ cm$^{-2}$) of the GaN crystal 52A in the case of using alumina is smaller than the dislocation density ($6.4 \times 10^5$ cm$^{-2}$) of the GaN crystal 52B in the case of using YAG.

The dislocation density ($2.0 \times 10^5$ cm$^{-2}$) of the GaN crystal 52A according to the example 1-3 was substantially equal to the dislocation density ($2.1 \times 10^5$ cm$^{-2}$) of the GaN crystal 52B in the case of using the seed crystal 6B manufactured by the flux method. This result indicates that the use of the seed crystal 6A, which is manufactured by the vapor phase epitaxy and is relatively cheap, also makes it possible to grow the GaN crystal 52A having the dislocation density equivalent to that in the case of using the seed crystal 6B, which is manufactured by the flux method and is relatively expensive.

Evaluation on the Inclusion

An inspection substrate having a predetermined size was cut out from the grown GaN crystals 52A and 52B to measure the content percentage of the inclusion included in the inspection substrate. The inspection substrate was obtained by grinding the outer periphery of the GaN crystals 52A and 52B and polishing the surface thereof. The inspection substrate had a wafer shape of 2 inch size, and the surface thereof was mirror-finished. Each inspection substrate had a fixed thickness of 0.4 mm. The measurement of the content percentage of the inclusion was made not on the interface layer 51 but on the crystal growth portion (portions represented by 52A and 52B in FIGS. 3 and 4).

The following describes the process for measuring the content percentage of the inclusion. First, an image of the inspection substrate was captured with a digital camera, and the image data was stored in a computer. Subsequently, the stored image data was processed with image processing software to binarize the captured image. Binarization is processing for converting an image into an image expressed by two tones of black and white. A threshold was set in the image processing software such that a black portion corresponded to an area including the inclusion.

Figure 6:
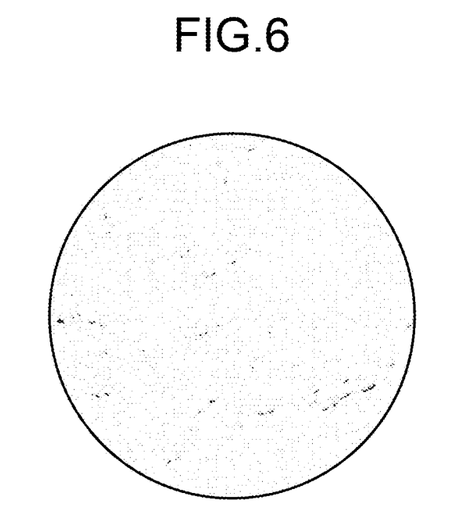
FIG. 6 is a view of an image of an inclusion included in an inspection substrate manufactured using a GaN crystal according to the example 1-2.
Figure 7:
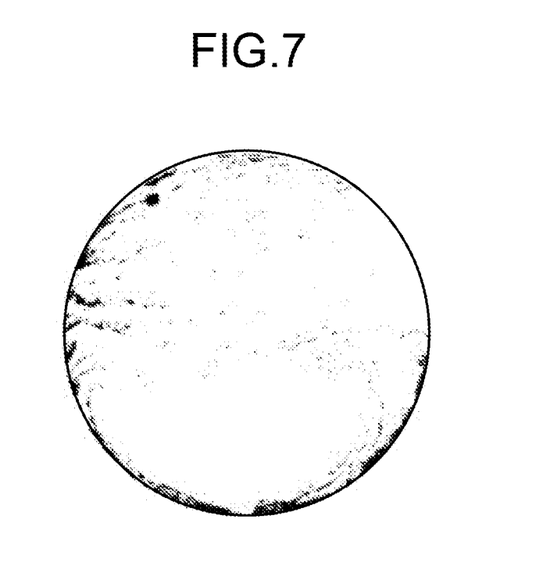
FIG. 7 is a view of an image of an inclusion included in an inspection substrate manufactured using a GaN crystal according to the example 1-3.
Figure 8:
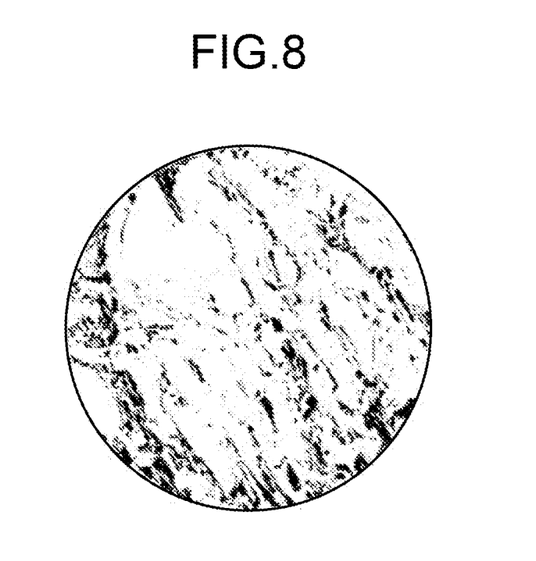
FIG. 8 is a view of an image of an inclusion included in an inspection substrate manufactured using a GaN crystal according to the comparative example 2-1.

FIG. 6 is a view of an image of the inclusion included in the inspection substrate manufactured using the GaN crystal 52A according to the example 1-2. FIG. 7 is a view of an image of the inclusion included in the inspection substrate manufactured using the GaN crystal 52A according to the example 1-3. FIG. 8 is a view of an image of the inclusion included in the inspection substrate manufactured using the GaN crystal 52B according to the comparative example 2-1.

The proportion of the area of the black portion to the whole area of the binarized image was calculated as the content percentage of the inclusion. The edge of the inspection substrate may be captured black because of the environment for capturing the inspection substrate, in particular the light intensity, the direction of light, and the like. To address this, the calculation is made defining the portion inside a line positioned inside the edge of the inspection substrate by 2 mm as the whole area of the inspection substrate.

As indicated in Table 1, the inclusion in the example 1-1 and the comparative example 1-1 where the off-angle θ was 0° to 0.5° was approximately 0%. In other words, an off-angle θ of 0° to 0.5° scarcely generates the inclusion regardless of whether the material for the contact members is alumina or YAG.

As is clear from comparison among the examples 1-1, 1-2, 1-3, and the comparative example 2-1 and comparison among the comparative examples 1-1, 1-2, 1-3, and 2-2, the content percentage of the inclusion increases as the off-angle θ increases. In the comparative examples 2-1 and 2-2 where the off-angle θ is 2.5° to 3.0°, the content percentage of the inclusion exceeds 10%. Generally, a substrate having a content percentage of the inclusion exceeding 10% is not suitably used as a substrate for an electronic device and the like. In the comparative example 6 where the seed crystal 6B manufactured by the flux method was used, the content percentage of the inclusion in the seed crystal 6B was substantially equal to that of the inclusion in the grown GaN crystal 52B.

Thus, an increase in the off-angle θ has an effect (advantageous effect) to decrease the dislocation density and an effect (disadvantageous effect) to increase the inclusion.

Evaluation on the PL Spectrum

A photoluminescence (PL) spectrum was measured on the grown GaN crystals 52A and 52B according to the example 1-1 and the comparative examples 1-1 and 6 and on the interface layer 51 according to the example 1-1. A section perpendicular to the c-plane of the interface layer 51 and the GaN crystal 52A formed on the seed crystal 6A (refer to FIG. 3) and of the GaN crystal 52B formed on the seed crystals 6A and 6B (refer to FIG. 4) was exposed and observed with a fluorescence microscope. The observation with the fluorescence microscope was performed with wavelengths shorter than 420 nm cut by a wavelength absorption filter.

In the GaN crystal 52A according to the example 1-1 and the GaN crystal 52A according to the comparative example 6, emission of light-blue to green light was detected. Emission of light-blue to green light means that the GaN crystal 52A appears substantially light-blue to green to the naked eye (the same will apply hereafter). In the GaN crystal 52B according to the comparative example 1-1, emission of yellow light was detected. In other words, emission of similar light was detected in the example 1-1 where the seed crystal 6A manufactured by the vapor phase epitaxy was combined with alumina and the comparative example 6 where the seed crystal 6B manufactured by the flux method was combined with alumina. By contrast, emission of different light was detected between the example 1-1 where the seed crystal 6A was combined with alumina and the comparative example 1-1 where the seed crystal 6A was combined with YAG. In the seed crystal 6A used in the example 1-1 and the comparative example 1-1, emission of yellow light was detected. In the interface layer 51 according to the example 1-1, emission of red light was detected.

Figure 9:
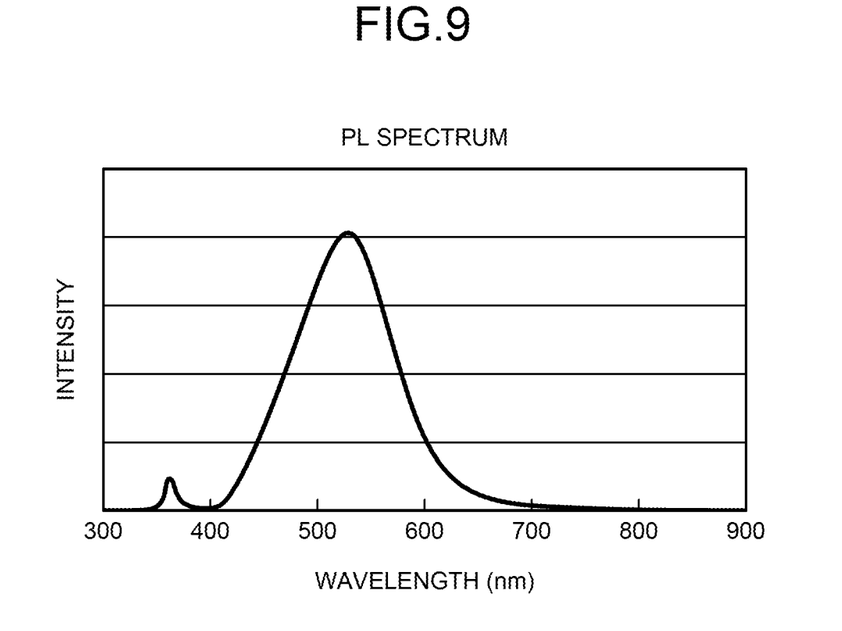
FIG. 9 is a graph indicating a result of measurement of a PL spectrum of a GaN crystal according to the example 1-1.

FIG. 9 is a graph indicating the result of measurement of the PL spectrum of the GaN crystal 52A according to the example 1-1. The measurement target was the portion where emission of light-blue to green light was detected. In the measurement of the PL spectrum of the measurement target, a peak was detected at around 530 nm. In the measurement of the PL spectrum of the GaN crystal 52A according to the comparative example 6, a result similar to the measurement result illustrated in FIG. 9 was obtained while the intensity of the peak was different.

Figure 10:
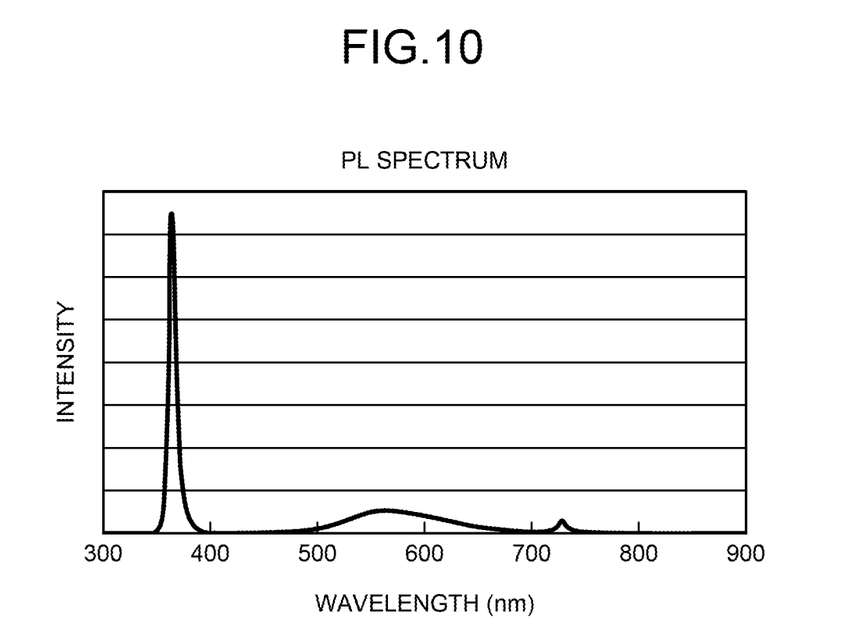
FIG. 10 is a graph indicating a result of measurement of a PL spectrum of a GaN crystal according to the comparative example 1-1.

FIG. 10 is a graph indicating the result of measurement of the PL spectrum of the GaN crystal 52B according to the comparative example 1-1. The measurement target was the portion where emission of yellow light was detected. In the measurement of the PL spectrum of the measurement target, a sharp peak at around 365 nm and a broad peak at around 570 nm were detected. The peak at around 365 nm is a photoluminescence emission peak corresponding to the band edge of the GaN crystal 52B serving as the measurement target.

Figure 11:
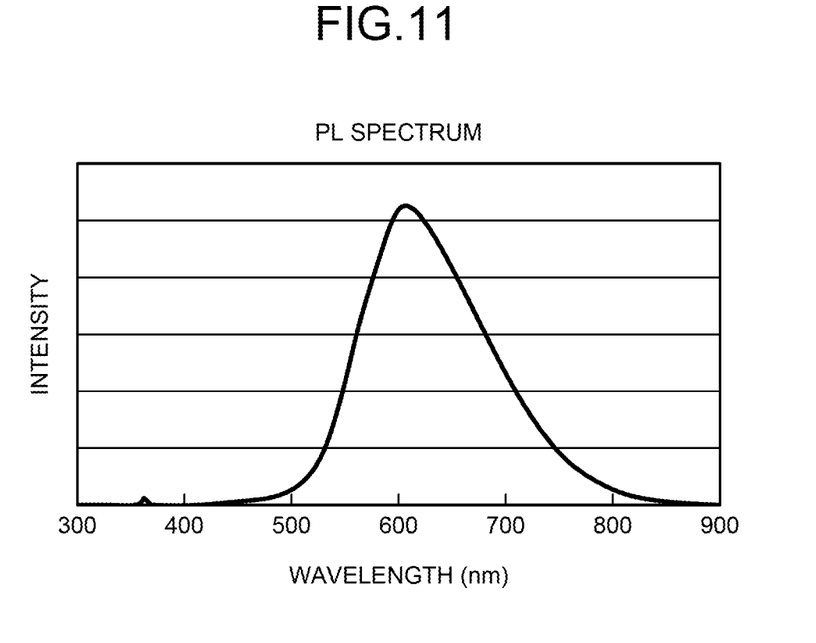
FIG. 11 is a graph indicating a result of measurement of a PL spectrum of an interface layer according to the example 1-1.

FIG. 11 is a graph indicating the result of measurement of the PL spectrum of the interface layer 51 according to the example 1-1. The measurement target was the portion where emission of red light was detected. In the measurement of the PL spectrum of the measurement target, a peak was detected at around 610 nm.

As described above, the interface layer 51 has the photoluminescence emission peak whose wavelength is longer than the wavelength (530 nm) of the photoluminescence emission peak of the grown GaN crystal 52A as illustrated in FIG. 9. To manufacture the GaN crystal 52A as a group 13 nitride crystal, the wavelength of the photoluminescence emission peak of the interface layer 51 preferably falls within a range of 650±30 nm. The photoluminescence emission peak falling within the range makes it possible to provide the GaN crystal 52A having a sufficient quality. In the examples 1-2 and 1-3 and the comparative example 2-1, results similar to that of the example 1-1 were obtained.

The characteristics of the interface layer 51 are not limited to the GaN crystal and are also applicable to other group 13 nitride crystals. In a case where a seed crystal made of a group 13 nitride crystal manufactured by the vapor phase epitaxy is used to grow the group 13 nitride crystal, the photoluminescence emission peak of an interface layer formed between the seed crystal and the grown group 13 nitride crystal appears at a longer-wavelength side than the photoluminescence emission peak of the grown group 13 nitride crystal.

Consideration of Formation of the Interface Layer

In a case where alumina is used for the contact members (e.g., the inner wall of the reaction vessel 13, the holding member 21, and the fixing member 22) coming into contact with the mixed melt 5, the weight of the contact members decreases after the crystal growth process is performed. This phenomenon leads to the following assumption: alumina is dissolved into the mixed melt 5 from the contact members during the crystal growth process; and a substance derived from alumina affects formation of the interface layer 51 in some way. Examples of the substance derived from alumina may include an aluminum ion, an oxygen ion, an alumina solid solution, and an alumina fine particle. Furthermore, Si contained in the seed crystal 6A manufactured by the vapor phase epitaxy may affect the formation. When the mixed melt 5 is in a high-temperature state, for example, the seed crystal 6A may be slightly melted (melt-back). At this time, Si contained in the seed crystal 6A may be dissolved into the mixed melt 5 and affect the formation of the interface layer 51. These impurities present in the mixed melt 5 under certain conditions are expected to cause the formation of the interface layer 51. Examples of the certain conditions may include the type of the impurities, the concentration of the impurities, the temperature, and the pressure.

Thus, even in a case where the seed crystal 6A manufactured by the vapor phase epitaxy and having a relatively large dislocation density (e.g., $5\times10^6$ cm$^{-2}$), the use of alumina for the contact members coming into contact with the mixed melt 5 makes it possible to provide a high-quality group 13 nitride crystal (e.g., the GaN crystal 52A) having a dislocation density (e.g., $2.4\times10^5$ cm$^{-2}$) smaller than that of the seed crystal 6A by one figure or more. Furthermore, by setting the off-angle θ to the principal plane of the seed crystal 6A to an appropriate value, a high-quality group 13 nitride crystal can be provided having a smaller dislocation density and less inclusion. Because the high-quality group 13 nitride crystal can be provided using the seed crystal 6A, which is manufactured by the vapor phase epitaxy and is relatively cheap, the cost can be reduced. According to the embodiment, it can be possible to manufacture a high-quality group 13 nitride crystal at low cost.

While the embodiment, the examples, and the comparative examples have described the case where the GaN crystal is manufactured as a group 13 nitride crystal, the present invention is not limited thereto. The invention is also applicable to manufacturing of other group 13 nitride crystals.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

REFERENCE SIGNS LIST 1 manufacturing apparatus
5 mixed melt
6, 6A, 6B seed crystal
11 pressure resistant vessel
12 inner vessel
13 reaction vessel
21 holding member
22 fixing member
25 turntable
26 rotating shaft
27 rotating mechanism
28 heater
31, 32, 33 pipe
34 nitrogen supply pipe
35 diluent gas supply pipe
36, 37, 38, 39, 40 valve
41, 42 pressure control device
45 pressure gauge
50 miscellaneous crystal
51 interface layer
52A, 52B GaN crystal

CITATION LIST

Patent Literatures

Patent Literature 1: PCT Publication No. 2009-011407
Patent Literature 2: Japanese Laid-open Patent Publication No. 2012-006794
Patent Literature 3: Japanese Laid-open Patent Publication No. 2011-105586
Patent Literature 4: Japanese Laid-open Patent Publication No. 2005-263535
Patent Literature 5: PCT Publication No. 2010-140665
Patent Literature 6: Japanese Laid-open Patent Publication No. 2009-212284

Non Patent Literatures

Non-patent Literature 1: JAP97(2005)061301

The invention claimed is:

1. A method for manufacturing a group 13 nitride crystal, comprising:
arranging a seed crystal in a mixed melt containing an alkali metal and a group 13 element, retained in a reaction vessel,
the seed crystal being a group 13 nitride seed crystal manufactured by vapor phase epitaxy and having an off-angle 1.5° or more and 2° or less with respect to a principal plane of the seed crystal, and
a member made of alumina, whose purity is higher than 99.9% and whose Si concentration is lower than 100 ppm, being arranged in the reaction vessel and in contact with the mixed melt; and
growing an interface layer on the principal plane of the seed crystal; and
supplying a nitrogen-containing gas into the mixed melt and growing a group 13 nitride crystal on the interface layer, which was grown on the seed crystal,
a pressure of the nitrogen-containing gas in growing the group 13 nitride crystal being set higher than a pressure of the nitrogen-containing gas in elevating a temperature in the reaction vessel to a crystal growth temperature of the group 13 nitride crystal, and
the interface layer having a photoluminescence emission peak whose wavelength is longer than a wavelength of a photoluminescence emission peak of the grown group 13 nitride crystal.

2. The method for manufacturing a group 13 nitride crystal according to claim 1, wherein each of one or more members made of alumina is provided in contact with the mixed melt, and a purity of each of the one or more members is higher than 99.9% and an Si concentration of each of the one or more members is more than 25 ppm and lower than 100 ppm.

3. The method for manufacturing a group 13 nitride crystal according to claim 1, wherein the pressure of the nitrogen-containing gas in elevating the temperature in the reaction vessel to the crystal growth temperature of the group 13 nitride crystal is 2.2 MPa, and the pressure of the nitrogen-containing gas in growing the group 13 nitrogen crystal is 3.0 MPa.

4. The method for manufacturing a group 13 nitride crystal according to claim 1, wherein the seed crystal contains Si.

5. The method for manufacturing a group 13 nitride crystal according to claim 1, wherein the group 13 nitride crystal is a GaN crystal.

6. The method for manufacturing a group 13 nitride crystal according to claim 5, wherein the wavelength of the photoluminescence emission peak of the interface layer falls within a range of 650±30 nm.

7. The method for manufacturing a group 13 nitride crystal according to claim 1, wherein the seed crystal has a substrate shape.

8. The method for manufacturing a group 13 nitride crystal according to claim 1, wherein the interface layer formed between the seed crystal and the grown group 13 nitride crystal has different physical properties from those of the seed crystal and has different physical properties from those of the grown group 13 nitride crystal.

* * * * *